United States Patent
Hsu et al.

(10) Patent No.: US 6,995,025 B2
(45) Date of Patent: Feb. 7, 2006

(54) ASYMMETRICAL PROGRAMMING FERROELECTRIC MEMORY TRANSISTOR

(75) Inventors: Sheng Teng Hsu, Camas, WA (US); Tingkai Li, Vancouver, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 10/873,326

(22) Filed: Jun. 21, 2004

(65) Prior Publication Data

US 2005/0282296 A1    Dec. 22, 2005

(51) Int. Cl.
    *H01L 21/00*    (2006.01)
(52) U.S. Cl. .......................................... 438/3; 438/286
(58) Field of Classification Search ................ 438/3, 438/238, 240, 254, 278, 286, 289, 381, 680
    See application file for complete search history.

(56) References Cited

U.S. PATENT DOCUMENTS

| 5,962,884 | A | 10/1999 | Hsu et al. |
| 6,048,740 | A | 4/2000 | Hsu et al. |
| 6,117,691 | A | 9/2000 | Hsu et al. |
| 6,411,542 | B1 * | 6/2002 | Yang et al. ............... 365/145 |
| 6,420,742 | B1 * | 7/2002 | Ahn et al. ................ 257/295 |
| 6,531,324 | B2 | 3/2003 | Hsu et al. |
| 6,531,325 | B1 * | 3/2003 | Hsu et al. ................. 438/3 |

OTHER PUBLICATIONS

U.S. Appl. No. 10/659,547, filed Sep. 9, 2003, Hsu et al.

* cited by examiner

*Primary Examiner*—David Nhu
(74) *Attorney, Agent, or Firm*—Robert D. Varitz, PC

(57) ABSTRACT

A method of fabricating and programming a ferroelectric memory transistor for asymmetrical programming includes fabricating a ferroelectric memory transistor having a metal oxide layer overlaying a gate region; and programming the ferroelectric memory transistor so that a low threshold voltage is about equal to the intrinsic threshold voltage of the ferrorelectric memory transistor.

6 Claims, 3 Drawing Sheets

ASYMMETRICAL PROGRAMMING FERROELECTRIC MEMORY TRANSISTOR

FIELD OF THE INVENTION

This invention relates to ferroelectric non-volatile memory, and specifically to a method of fabricating a ferroelectric memory transistor having optimal intrinsic threshold voltages.

BACKGROUND OF THE INVENTION

The state of the art programming of a ferroelectric memory transistor requires application of a voltage to a control gate, thus pulling the ferroelectric thin film to saturation, polarizing to both polarities. When holes are pulled to the top of the memory film, the threshold voltage of an n-channel memory transistor is programmed to a high threshold voltage state. When electrons are pulled to the top of the memory film, the threshold voltage of the n-channel memory transistor is programmed to a low-threshold voltage state. In order to minimize standby power consumption, the threshold voltage of the n-channel memory transistor must be a positive voltage in its standby condition. Therefore, the intrinsic threshold voltage of the n-channel memory transistor has to be larger than one-half of the memory window of the device, requiring that the channel doping density be very large, which results in a low effective channel mobility. The forgoing conditions result in a degraded memory operation speed. A large polarization of a MFMIS transistor also induces a large depolarization field, resulting in a relatively short memory retention time.

For an n-channel metal-ferroelectric metal oxide (MF-Mox) memory transistor, the metal oxide is a n-type semiconductive thin film deposited onto a p-type silicon (well). When the device is programmed to its "OFF" state, i.e., a high threshold voltage state, the ferroelectric thin film is polarized, with the holes therein pulled to the interface with the top electrode. The n-type semiconductive metal oxide is depleted and the surface of the p-type silicon is accumulated. When the gate electrode is grounded, the voltage across the ferroelectric thin film generates a voltage of a polarity opposite that of the polarization voltage. As a result, the polarization charge decreases with time. The voltage across the ferroelectric is called the de-polarization voltage. The de-polarization field tends to decrease the "OFF" state threshold voltage.

When a memory device is programmed to a low threshold voltage, the ferroelectric thin film is polarized with negative charges pulled to the top of the FE-electrode interface. The n-type semiconductive metal oxide is also completely depleted because of the flat band voltage of the gate stack and the metal oxide-to-p-type silicon induced depletion region. The flat band voltage is the difference of work function between the top electrode and the silicon substrate. Again, there is a de-polarization voltage across the ferroelectric thin film. The de-polarization thin film tends to increase the "ON" state threshold voltage. As the "ON" state threshold voltage is increased, the drive current of the memory transistor decreases and the speed of the device decreases. If the ferroelectric thin film is not polarized at the "ON" state, the "ON" state threshold voltage will not change with time, rendering device performance independent of time. There is no performance degradation. This is a significant advantage of an asymmetrical programming ferroelectric memory transistor.

U.S. Pat. No. 5,962,884, for Single Transistor Ferroelectric Memory Cell with Asymmetric Ferroelectric Polarization and Method for Same, of Hsu et al., granted Oct. 5, 1999, describes a method of forming a semiconductor structure having a ferroelectric memory (FEM) gate unit on a silicon substrate having plural conductive channels of a known doping type for use as a source junction region and a drain junction region; and depositing an FEM gate unit over the gate junction, wherein an insulating layer overlays the junction regions, the FEM gate unit and the substrate.

U.S. Pat. No. 6,048,740, for Ferroelectric Nonvolatile Transistor and Method of Making Same, of Hsu et al., granted Apr. 11, 2000, describes a method of fabricating a ferroelectric memory transistor using a lithographic process having a fine alignment tolerance which is equal to the alignment tolerance of the lithographic process.

U.S. Pat. No. 6,117,691, for Method of Making a Single Transistor Ferroelectric Memory Cell with Asymmetrical Ferroelectric Polarization, of Hsu et al., granted Sep. 12, 2000, describes a ferroelectric memory cell formed on a silicon substrate, wherein a FEM gate unit overlays the conductive channel of the gate junction region and an insulating layer overlays the junction regions, the FEM gate unit and the substrate.

U.S. Pat. No. 6,531,324, for MFOS Memory Transistor and Method of Fabricating Same, of Hsu et al., granted Mar. 11, 2003, describes a ferroelectric transistor gate structure with a ferroelectric gate and passivation sidewalls. The passivation sidewalls serve as insulators to reduce, or eliminate, the diffusion of oxygen or hydrogen into the ferroelectric gate. A method of forming the ferroelectric gate structure is also provided. The method comprises the steps of forming a sacrificial gate structure, removing the sacrificial gate structure, depositing passivation insulator material, etching the passivation insulator material using anisotropic plasma etching to form passivation sidewalls, depositing a ferroelectric material, polishing the ferroelectric material using CMP, and forming a top electrode overlying the ferroelectric material.

U.S. patent application Ser. No. 10/659,547, filed Sep. 9, 2003, for Conductive Metal Oxide Gate Ferroelectric Memory Transistor, of Hsu et al., describes a method of fabricating a ferroelectric device wherein a gate insulator is replaced with a conductive metal oxide.

SUMMARY OF THE INVENTION

A method of fabricating and programming a ferroelectric memory transistor for asymmetrical programming includes fabricating a ferroelectric memory transistor having a metal oxide layer overlaying a gate region; and programming the ferroelectric memory transistor so that a low threshold voltage is about equal to the intrinsic threshold voltage of the ferroelectric memory transistor.

It is an object of the invention to provide a ferroelectric memory transistor having an optimal intrinsic threshold voltage.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

One of the simplest solutions to the problems associated with prior art devices, identified above, is to keep the ferroelectric thin film at neutral, i.e., not polarized, at the low threshold voltage state. Such a ferroelectric memory transistor, depicted in FIGS. 1 and 2, and described in detail in co-pending U.S. patent application Ser. No. 10/659,547, may be fabricated and programmed according to the steps depicted in FIG. 3.

Figure 1:
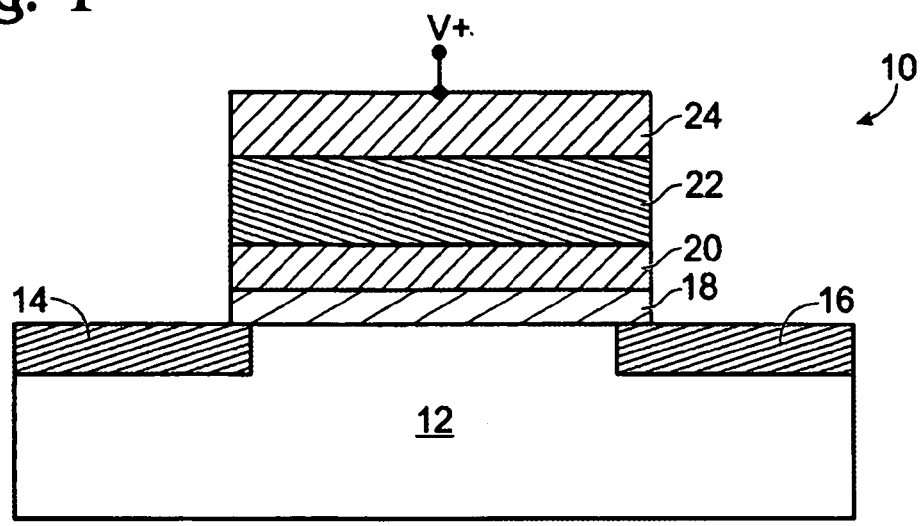
FIG. 1 depicts a portion of a semiconductor device constructed according to the invention.
Figure 2:
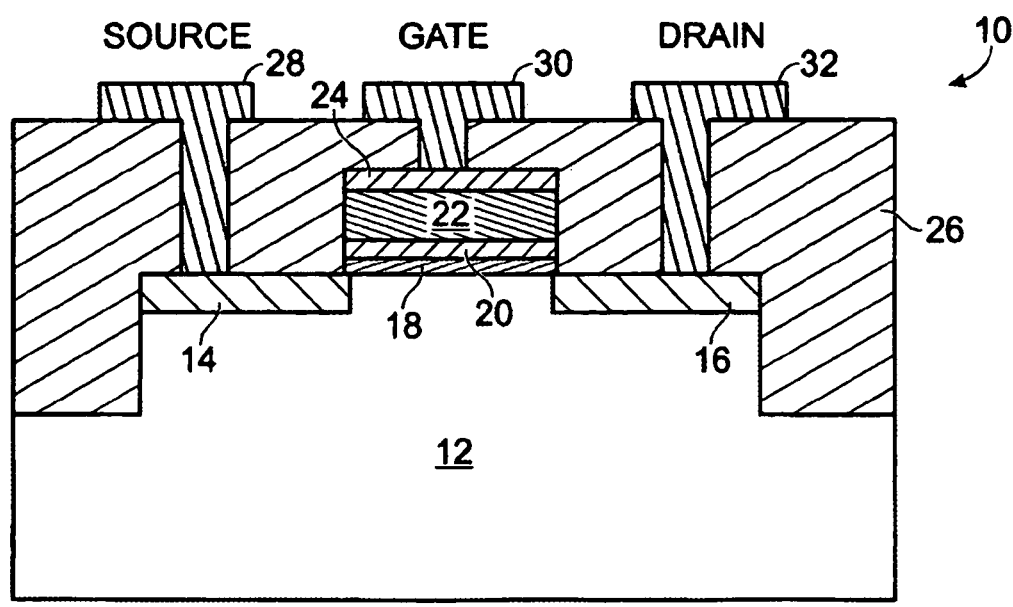
FIG. 2 depicts a completed semiconductor device constructed according to the invention.

Referring now to FIGS. 1 and 2, a ferroelectric memory transistor is depicted generally at 10, and is shown at a mid-point in the fabrication process in FIG. 1. Transistor 10 includes a silicon substrate 12, which is doped to p-type silicon in the embodiment described as an example herein. An n+ source 14 and an n+ drain 16 surround a gate region, which is covered by an n-type metal oxide 18, e.g. $In_2O_3$, which is covered by a bottom electrode 20, e.g. Ir. A ferroelectric layer 22, such as lead germanium oxide ($Pb_5Ge_3O_{11}$) (PGO), is formed on bottom electrode 20, and has a top electrode 24, e.g., Al or Cu, formed thereon. The completed device is shown in FIG. 2, and includes an oxide layer 26, a source electrode 28, a gate electrode 30 and a drain electrode 32.

Figure 3:
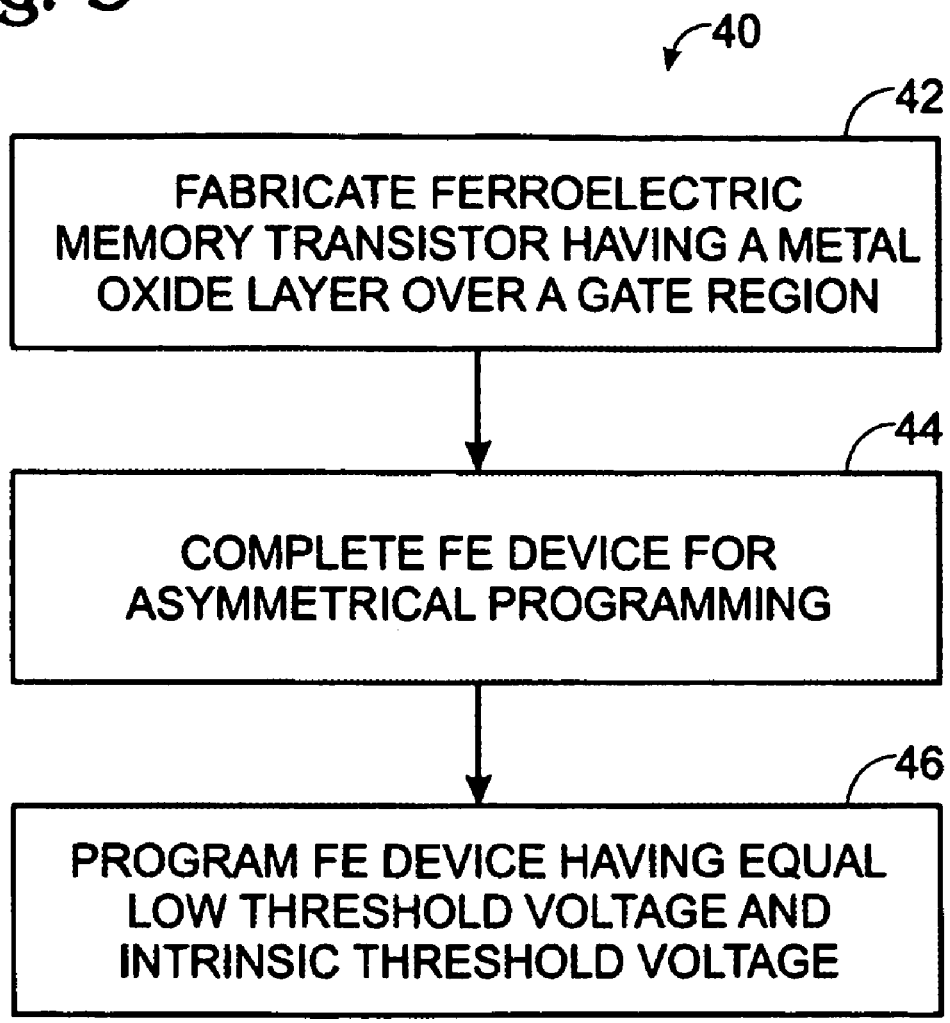
FIG. 3 is a block diagram depicting the method of the invention.

The method of the invention is depicted in block diagram form in FIG. 3 generally at 40, and includes the steps of fabricating the FE memory transistor 42, completing the FE device to render it suitable for asymmetrical programming 44, and programming the device such that the low threshold voltage and the device intrinsic voltage are about equal 46. The memory window is thus defined as the difference between the high threshold voltage and the intrinsic threshold voltage, rather than between the high threshold voltage and the low threshold voltage, thus, the window is asymmetric about the intrinsic threshold voltage.

Figure 4:
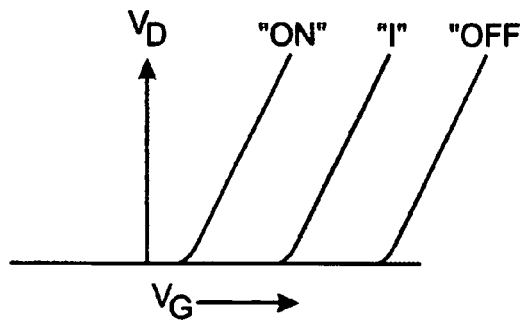
FIG. 4 depicts a drain I-V property of a prior art device.
Figure 5:
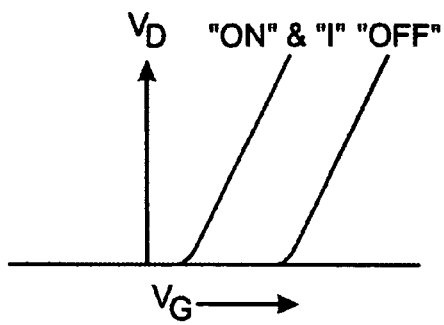
FIG. 5 depicts a drain I-V property of a device constructed according to the method of the invention.

The drain property of a prior art ferroelectric transistor is shown in FIG. 4. The curve denoted, as "I" is the intrinsic characteristic of the device, i.e., the ferroelectric thin film is not polarized. The intrinsic threshold voltage of a state-of-the-art memory transistor has to be larger than one half of the memory window. Therefore, the channel doping density of a MFMIS transistor has to be very large. The drain property of a ferroelectric material of a device constructed according to the method of the invention is shown in FIG. 5, and is virtually not polarized at the low threshold voltage state. Therefore, the low threshold voltage is nearly identical to the intrinsic threshold voltage of the device.

The threshold voltage of the prior art programming process at the "ON" (high) and "OFF" (low) states are:

$$V_{TH} = V_{FB} + 2\varphi_{FP} + 2\sqrt{eqN\varphi_{FP}}\left(\frac{1}{C_{OX}} + \frac{1}{C_{FE}}\right) + \frac{Q_R}{C_{FE}} \quad (1)$$

$$V_{TL} = V_{FB} + 2\varphi_{FP} + 2\sqrt{eqN\varphi_{FP}}\left(\frac{1}{C_{OX}} + \frac{1}{C_{FE}}\right) - \frac{Q_R}{C_{FE}} \quad (2)$$

Where $Q_R$ is the polarization charge and $C_{OX}$ and $C_{FE}$ are the unit area capacitance of gate oxide and ferroelectric thin film, respectively, and wherein $V_{FB}$ is the flat band voltage, $\phi_{FB}$ is the Fermi potential of silicon, and N is the silicon doping density. The memory window is:

$$\Delta V_T = \frac{2Q_R}{C_{FE}} \quad (3)$$

For the programming process according to the method of the invention, the high threshold voltage is the same as Eq. (1), while the low threshold voltage and the memory window are:

$$V_{TL} = V_{FB} + 2\varphi_{FP} + 2\sqrt{eqN\varphi_{FP}}\left(\frac{1}{C_{OX}} + \frac{1}{C_{FE}}\right) \quad (2a)$$

$$\Delta V_T = \frac{Q_R}{C_{FE}} \quad (3a)$$

The memory window is only one half as large as that of the state-of-the-art programming process.

A MFMox memory transistor does not have a gate insulator. Therefore, the threshold voltages and the memory window are:

$$V_{TH} = V_{FB} + \varphi_{SO} - \frac{\sqrt{2q\varepsilon N_A\varphi_{SO}} - Q_{PH}}{C_{FE}} \quad (4)$$

where $\phi_{SO}$ is the metal oxide surface potential at the threshold voltage of the device and $Q_{PH}$ is the "OFF" state polarization charge. The voltage across the ferroelectric thin film is:

$$V_{FE} \approx \frac{Q_{SiH} + qN_DW - Q_{PH}}{C_{FE}} = V_{FB} + \varphi_{SiH} \quad (4a)$$

In this expression $Q_{SiH}$ is the positive charge accumulated at the metal oxide to p-type silicon interface. There is no voltage across the ferroelectric thin film when:

$$Q_{PH} = qN_DW + Q_{SiH} \quad (4b)$$

And the threshold voltage, $\Delta V_{TH} = Q_{PH}/C_{FE}$ is larger than the intrinsic threshold voltage. Because there is no field across the ferroelectric thin film there is no depolarization problem.

The as-programmed $Q_{PH}$ maybe larger than that of Eq. 4b, There is a depolarized filed across the ferroelectric thin film. The polarization charge and $V_{TH}$ decreases with time. The "OFF" state threshold voltage is stabilized when the polarization charge is reduced to that of Eq. 4b. The threshold voltage at the "ON" state is given by:

$$V_{TL} = V_{FB} + \varphi_{SO} - \frac{\sqrt{2q\varepsilon N_A \varphi_{SO}} + Q_{PL}}{C_{FE}} \quad (5)$$

Where $Q_{PL}$ is the "ON" state polarization charge. The voltage across the ferroelectric thin film is:

$$V_{FE} = \frac{\sqrt{2q\varepsilon N_D \varphi_{sL}} + Q_{PL}}{C_{FE}} = -(V_{FB} + \varphi_{SL}) \quad (5a)$$

When there is no polarization charge, the field intensity across the ferroelectric thin film is very low. When this field is lower than the cursive field of the ferroelectric thin film material there is no time-dependent polarization charge density. The threshold voltage is independent of time. As a result very long memory retention device can be obtained even the threshold voltage window of the device is only $Q_{PH}/C_{FE}$.

Similarly, the low threshold voltage state of a MFMIS may be programmed to a no polarization condition. Although the memory window is reduced by half, there is no threshold voltage degradation at the "ON" state, and the memory retention time of the transistor is longer.

Figure 6:
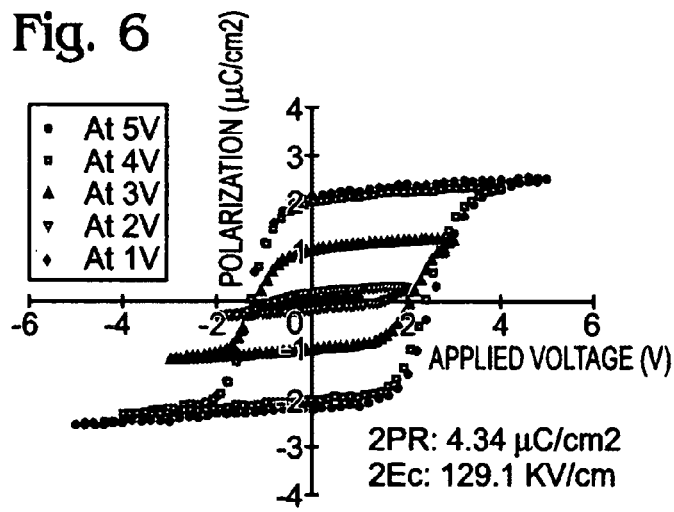
FIG. 6 depicts a drain current-voltage property of a FE memory transistor constructed according to the method of the invention at a relatively low Pr.
Figure 7:
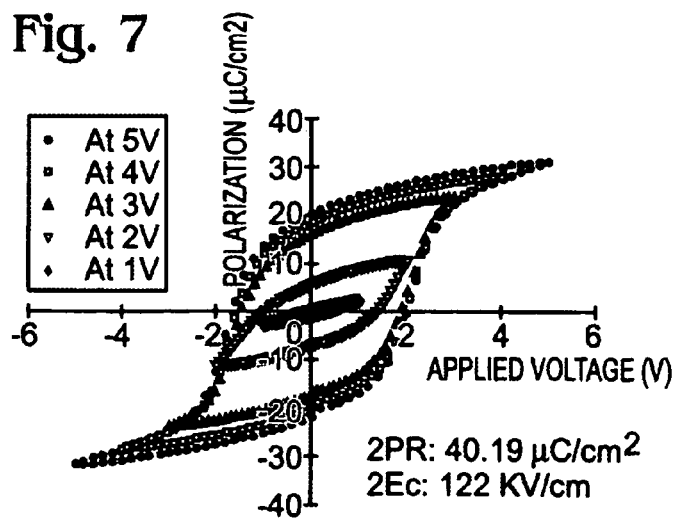
FIG. 7 depicts a drain current-voltage property of a FE memory transistor constructed according to the method of the invention at a relatively high Pr.

FIG. 6 is the typical PGO hysteresis loop, while that of PZT is shown in FIG. 7. Programming the memory transistor to high threshold voltage "OFF" state requires application of an effective voltage of about –4V to the control gate. The ferroelectric thin film is polarized to about –2 Coul and –20 Coul for a PGO gate and a PZT gate, respectively. For a memory array, this is done in a word or a block programming process. Programming a given bit to the low threshold voltage "ON" state requires application of an effect voltage of about 1.5V to the control gate. The polarized charges are nearly completely removed. One of ordinary skill in the art will understand that the voltages and the polarization charges cited here is for reference only, and vary according to each individual material and process conditions used in a given memory array.

In a commercially produced circuit, some of the residual polarization charge remains. The threshold voltage variation caused by a residual polarization charges is equal to the residual charge divided by the ferroelectric thin film capacitance. This problem also exist when the ferroelectric thin film is pulled to its "saturation" condition, because the polarization charge at saturation is dependent on material uniformity and process condition.

Thus, a method of asymmetrical programming for a ferroelectric memory transistor has been disclosed. It will be appreciated that further variations and modifications thereof may be made within the scope of the invention as defined in the appended claims.

We claim:

1. A method of fabricating and programming a ferroelectric memory transistor for asymmetrical programming, comprising:

fabricating a ferroelectric memory transistor having a metal oxide layer overlaying a gate region wherein a memory window is defined by:

$$\Delta V_T = \frac{2Q_R}{C_{FE}}$$

; and programming the ferroelectric memory transistor so that a low threshold voltage is about equal to an intrinsic threshold voltage of the ferrorelectric memory transistor.

2. The method of claim 1 wherein the ferroelectric memory transistor is a MFMox transistor and the intrinsic and low threshold voltages are define by:

$$V_{TL} = V_{FB} + \varphi_{SO} - \frac{\sqrt{2q\varepsilon N_A \varphi_{SO}} - Q_{PL}}{C_{FE}}.$$

3. The method of claim 2 wherein $Q_{PL}$ is nearly equal to zero, and the ferroelectric memory transistor is a MFMox transistor and the intrinsic and low threshold voltages are define by:

$$V_{TL} = V_{FB} + \varphi_{SO} - \frac{\sqrt{2q\varepsilon N_A \varphi_{SO}}}{C_{FE}}.$$

4. A method of fabricating and programming a ferroelectric memory transistor for asymmetrical programming, comprising:

fabricating a ferroelectric memory transistor having a metal oxide layer overlaying a gate region wherein a memory window is defined by:

$$\Delta V_T = \frac{2Q_R}{C_{FE}}$$

; and programming the ferroelectric memory transistor so that a low threshold voltage is about equal to an intrinsic threshold voltage of the ferrorelectric memory transistor.

5. The method of claim 4 wherein the ferroelectric memory transistor is a MFMox transistor and the intrinsic and low threshold voltages are define by:

$$V_{TL} = V_{FB} + \varphi_{SO} - \frac{\sqrt{2q\varepsilon N_A \varphi_{SO}} - Q_{PL}}{C_{FE}}.$$

6. The method of claim 4 wherein $Q_{PL}$ is nearly equal to zero, and the ferroelectric memory transistor is a MFMox transistor and the intrinsic and low threshold voltages are define by:

$$V_{TL} = V_{FB} + \varphi_{SO} - \frac{\sqrt{2q\varepsilon N_A \varphi_{SO}}}{C_{FE}}.$$

* * * * *